United States Patent [19]

Kasperkovitz et al.

[11] Patent Number: 4,642,482
[45] Date of Patent: Feb. 10, 1987

[54] LEVEL-SHIFTING CIRCUIT

[75] Inventors: Wolfdietrich G. Kasperkovitz; Johannes C. M. Meeuwis, both of Eindhoven, Netherlands

[73] Assignee: U.S. Philips Corporation, New York, N.Y.

[21] Appl. No.: 743,252

[22] Filed: Jun. 11, 1985

[30] Foreign Application Priority Data

Jun. 12, 1984 [NL] Netherlands ........................ 8401847

[51] Int. Cl.⁴ .............................................. H03K 5/01
[52] U.S. Cl. ................... 307/264; 307/362; 307/491; 307/494; 307/475
[58] Field of Search ............... 307/264, 268, 491, 494, 307/291, 362, 475; 330/252, 261

[56] References Cited

U.S. PATENT DOCUMENTS 4,563,600  1/1986  Kobayashi et al. ................. 307/475

Primary Examiner—John Zazworsky
Attorney, Agent, or Firm—Robert T. Mayer; Bernard Franzblau

[57] ABSTRACT

A level shifting circuit in which the collectors of a first transistor and a second transistor ($T_1$, $T_2$), which are coupled together as a differential pair, are each connected to a load resistor ($R_o$) and to the base of a third transistor and a fourth transistor ($T_3$, $T_4$), respectively, which are connected as emitter followers. In order to obtain a low dissipation for a specific gain and bandwidth, the collector of the third transistor ($T_3$) is coupled to a tapping (7) on the load resistor ($R_o$) of the second transistor ($T_2$) and the collector of the fourth transistor ($T_4$) is coupled to a tapping (6) on the load resistor ($R_o$) of the first transistor ($T_1$).

6 Claims, 6 Drawing Figures

LEVEL-SHIFTING CIRCUIT

The invention relates to a level-shifting circuit, comprising:
- a differential amplifier comprising a first transistor and a second transistor, whose collectors are each coupled to a power-supply terminal via a load resistor,
- a first voltage-follower circuit comprising a third transistor connected as an emitter follower and having its base coupled to the collector of the first transistor, and
- a second voltage-follower circuit comprising a fourth transistor connected as an emitter follower and having its base coupled to the collector of the second transistor.

Such a circuit may be used in general for matching the direct voltage level at the output of a circuit to the direct voltage level at the input of a following circuit. In particular, such a circuit may be arranged between successive divider stages in a high-frequency pre-scaling circuit for use in video equipment.

Such a level shifting circuit is known inter alia from U.S. Pat. No. 4,237,388. In general, the differential amplifier in such a circuit provides an additional voltage gain which ensures that the overall gain of the system in which the circuit is employed is adequate, and the actual shift of the direct voltage level is effected by the emitter-follower circuits.

A drawback of this known circuit is that in order to obtain a sufficiently large bandwidth it dissipates a comparatively high power for a specific gain. In principle, this dissipation may be reduced by reducing the quiescent current in the transistors of the differential amplifier, but this means that the load resistance has to be increased in order to obtain the desired gain. Indeed, the gain is proportional to the product of the load resistance and the quiescent current. However, increasing the load resistance leads to a reduction of the bandwidth of the circuit. The bandwidth is dictated by a time constant which depends mainly on the product of the load resistance and the effective capacitance between the inputs of the emitter-follower circuits. This capacitance is determined by the capacitances of the emitter-follower transistors and the input capacitance of the circuit with which the emitter followers are loaded.

Therefore, it is an object of the invention to provide a level-shifting circuit which has a smaller dissipation than the known circuit for substantially the same gain and bandwidth. According to the invention a circuit of the type defined in the opening paragraph is characterized in that
- the collector of the third transistor is coupled to a tapping on the load resistor of the second transistor, and
- the collector of the fourth transistor is coupled to a tapping on the load resistor of the first transistor.

As, in accordance with the invention, the collectors of the emitter-follower transistors are cross-coupled to tappings on the load resistors of the collectors of the differential amplifier, an additional amplification is obtained at high frequencies in the range where the gain of the known circuit already rolls off. This additional amplification results in an enlarged bandwidth of the circuit. If the bandwidth is maintained the dissipation can be reduced by reducing the quiescent current in the transistors.

The invention will now be described in more detail, by way of example, with reference to the accompanying drawings, in which.

Figure 1:
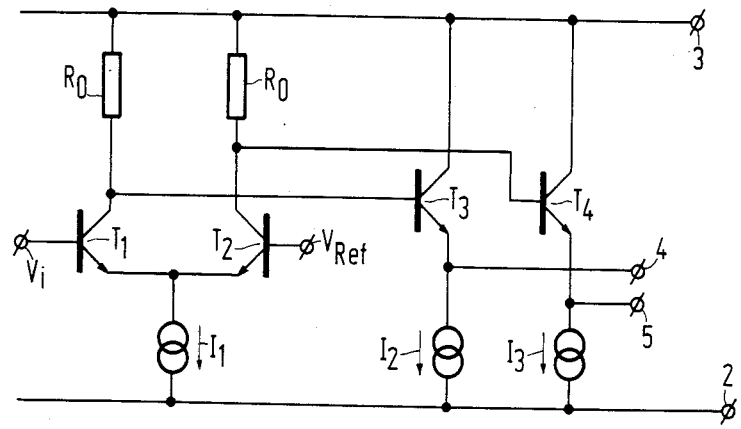
FIG. 1 shows a known level-shifting circuit.

FIG. 1 shows the diagram of the known level shifting circuit. It comprises a differential amplifier comprising two transistors $T_1$ and $T_2$ having a common emitter terminal coupled to the negative power-supply terminal 2 by means of a current source $I_1$. The collectors of the transistors $T_1$ and $T_2$ are each coupled to the positive power supply terminal 3 by means of a load resistor $R_o$. Further, the collector of the transistor $T_1$ is connected to the base of an emitter-follower transistor $T_3$, whose emitter is connected to the negative power-supply terminal 2 by means of a current source $I_2$ and whose collector is connected to the positive power-supply terminal 3. Similarly, the collector of the transistor $T_2$ is connected to the base of an emitter-follower transistor $T_4$ in whose emitter line a current source $I_3$ is arranged. The base of the transistor $T_2$ is at a reference voltage $V_{ref}$. The input signal $V_i$ is applied to the base of the transistor $T_1$. This input signal $V_i$ is received from a preceding circuit, whose output also carries a direct voltage equal to the reference voltage $V_{ref}$. The output voltages are taken from the outputs 4 and 5 which are connected to the emitters of the transistors $T_3$ and $T_4$. Thus, the differential amplifier $T_1$, $T_2$ has a single-ended drive and two complementary output signals are available at the outputs 4 and 5. This is for example necessary when the circuit is used for inter-coupling two frequency dividers, which in general comprise two complementary inputs and one output. The differential amplifier $T_1$, $T_2$ amplifies the input differential voltage $V_1 = V_i - V_{ref}$, the amplified voltage $V_2$ appearing between the outputs 4 and 5. The actual shift of the direct-voltage level is provided almost completely by the emitter-follower transistors $T_3$ and $T_4$. The direct voltage at the outputs 4 and 5 is one base-emitter voltage smaller than the collector direct voltage of the transistors $T_1$ and $T_2$, which is substantially equal to the direct voltage at the bases of these transistors.

Figure 2:
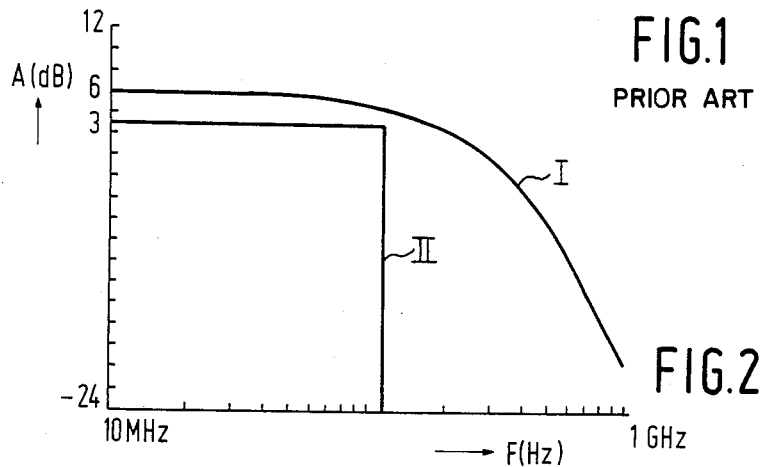
FIG. 2 shows a gain-versus-frequency characteristic of the circuit of FIG. 1.

To illustrate the properties of this level-shifting circuit FIG. 2 shows a voltage-versus-frequency characteristic I of the circuit when the outputs are loaded with a circuit comprising a differential input stage. The frequency F is plotted on a logarithmic scale and the gain A is expressed in decibels. The characteristic II in the Figure represents the specifications with which the circuit should comply in the present example. The gain A should be at least 3 dB and the bandwidth should be at least 120 MHz, while a voltage sweep of approximately 120 mV on the outputs should be possible. Since the gain already rolls off below this frequency, the circuit which can actually meet the specifications has a higher gain at lower frequencies and, in addition, the circuit operates over a wider frequency range than strictly necessary. For a supply voltage of 5 V the power dissipation of the circuit in the case of the characteristic I and an optimum design of the circuit is substantially equal to 5.5 mW.

Figure 3:
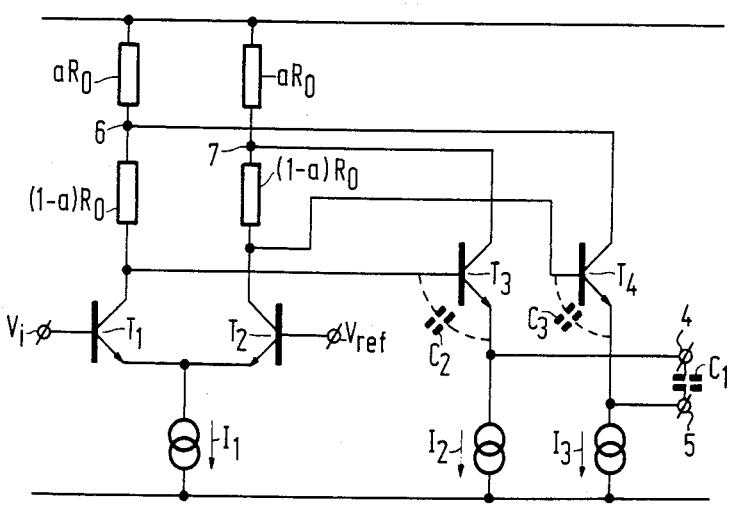
FIG. 3 shows a level-shifting circuit in accordance with the invention.
Figure 4:
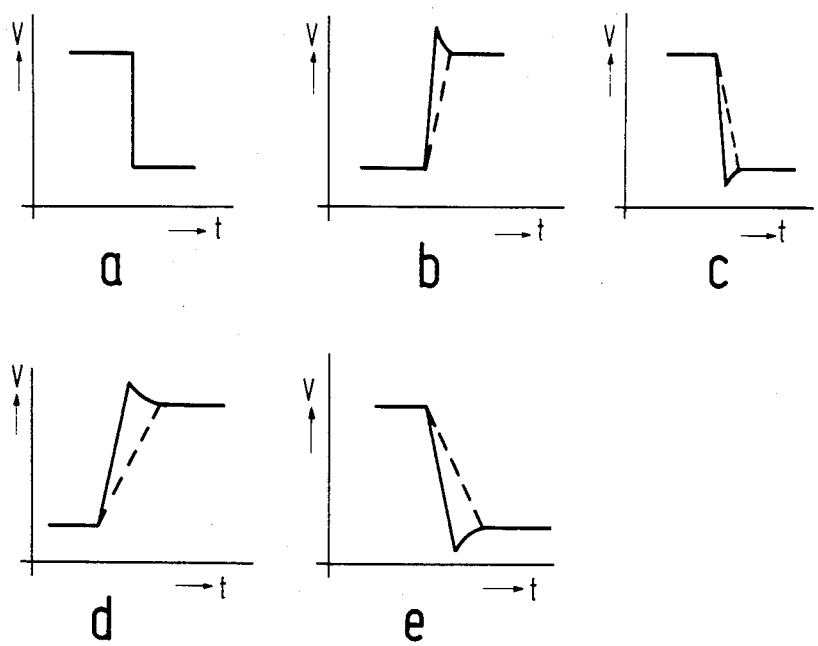
FIG. 4 shows voltage waveforms at some points in the circuit of FIG. 3, to illustrate the operation of the circuit.

FIG. 3 shows the level-shifting circuit in accordance with the invention, in which identical parts bear the same reference numerals as in FIG. 1. The load resistors of the transistors $T_1$ and $T_2$ are each divided into two resistors $aR_o$ and $(1-a)R_o$. The collector of the transistor $T_3$ is connected to the tapping 7 of the load resistor of the transistor $T_2$ and the collector of transistor $T_4$ is connected to the tapping 6 of the load resistor of the transistor $T_1$. At low frequencies the circuit operates in the same way as the circuit shown in FIG. 1. However, at high frequencies an additional amplification is obtained, which will be explained with reference to FIG. 4. It is assumed that the circuit is loaded with a circuit comprising a differential input stage. For an analysis of the behavior of the circuit at high frequencies it may be assumed that the circuit is capacitively loaded by the input capacitance of this stage, which in FIG. 3 is represented by the capacitance $C_1$ between the outputs 4 and 5, and which is shown in broken lines. The effective capacitance at the base of the transistor $T_3$ then depends on the junction capacitance and the depletion capacitance of the transistor $T_3$, which in FIG. 3 is shown in broken lines as the capacitance $C_2$, and on the capacitance $C_1$. Similarly, the effective capacitance at the base of the transistor $T_4$ depends on the capacitance $C_3$ between the base and the emitter of the transistor $T_4$, shown in broken lines, and on the capacitance $C_1$. It is to be noted that it is not necessary to provide a differential load for the circuit. It is alternatively possible to load only one of the outputs with a circuit. In that case a capacitance substantially equal to the input capacitance of the circuit must be connected to the other output. In order to explain the behaviour of the circuit at high frequencies an input voltage $V_i$ which decreases stepwise, as shown in FIG. 4a, is applied to the base of the transistor $T_1$. Initially this results in a stepwise voltage increase on the collector of the transistor $T_1$ and consequently on the base of the transistor $T_3$, and in a complementary voltage decrease on the collector of the transistor $T_2$ and hence on the base of the transistor $T_4$, as indicated by the broken lines in FIGS. 4b and 4c, respectively. As a result of stray capacitances in the differential amplifier these voltage steps are less steep than those of the input signal. The voltage step on the base of the transistor $T_3$ gives rise to a positive step in the collector current of the transistor $T_3$, so that the capacitance which acts effectively on the base of transistor $T_3$ is charged and the voltage on the output 4 follows the voltage on the base of the transistor $T_3$, as indicated by the broken line in FIG. 4d. Moreover, there is initially a negative peak in the collector current of the transistor $T_4$ and the voltage on the output 5 follows the voltage on the base of the transistor $T_4$, as indicated in FIG. 4e. As the collector of the transistor $T_3$ is coupled to the tapping 7 of the load resistor of the transistor $T_2$, the positive peak in the collector current of the transistor $T_3$ gives rise to a negative voltage peak in the voltage on the tapping 7. As a result of this voltage peak the voltage on the collector of the transistor $T_2$ exhibits an additional step, so that the actual voltage step on the collector of transistor $T_2$ is steeper, as indicated by the solid line in FIG. 4c. As a result of this, the effective capacitance at the base of the transistor $T_4$ is discharged more rapidly, which results in a more rapid decrease of the voltage on the output 5, as is indicated by the solid line in FIG. 4e. Since the collector of the transistor $T_4$ is connected to the tapping 6 of the load resistor of transistor $T_1$, the voltage on the collector of the transistor $T_1$ also exhibits an additional voltage step, so that the voltage on the output 4 increases more rapidly, as indicated by the solid lines in FIGS. 4b and 4d.

At high frequencies this results in an additional increase in gain so that the edges of the output voltages become steeper. As is known, this corresponds to an increase in bandwidth of the circuit. However, it also enables the dissipation of the circuit to be reduced. By increasing the load resistance the bandwidth can be reduced to the original value and the current of the current source $I_1$ can be reduced without a reduction of the gain.

Figure 5:
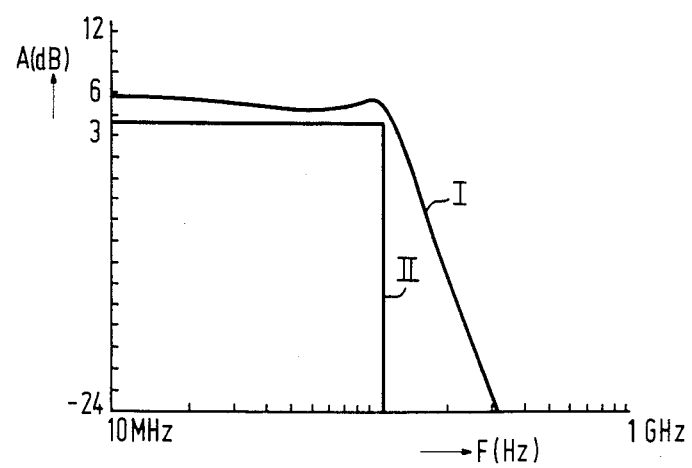
FIG. 5 shows a gain-versus-frequency characteristic of the circuit shown in FIG. 3.

In order to compare the properties of the circuit shown in FIG. 3 with those of the circuit shown in FIG. 1, FIG. 5 shows a gain-versus-frequency characteristic of the circuit, which circuit complies with the same requirements, i.e. it has a gain of at least 3 dB and a bandwidth of at least 120 MHz. As is apparent from the characteristic I, a rise in gain A occurs at higher frequencies in the range where the gain of the known circuit rolls off. This rise depends on the factor a which defines the locations of the tappings 6 and 7 on the load resistors. For a larger factor a a stronger rise in gain occurs. If the resistance $R_o$ and the current $I_1$ are maintained, this rise will result in an increase in the bandwidth of the circuit in comparison with that of the circuit shown in FIG. 1. However, in the circuit shown in FIG. 3 the bandwidth is made equal to that of the original circuit by increasing the load resistance $R_o$. Indeed, the bandwidth is inversely proportional to the value of the load resistors $R_o$. However, by increasing the load resistance $R_o$ the gain will increase if the current $I_1$ is maintained. In order to obtain the same gain the current $I_1$ may therefore be reduced. As a result of the rise in gain, the resistance of load resistors $R_o$ may therefore be increased and the current of the current source $I_1$ of the differential amplifier may be reduced, so that the dissipation is reduced while the gain and bandwidth remain substantially the same. For a supply voltage of 5 V the power dissipation of the circuit for the characteristic I is substantially 0.75 mW, which is approximately 15% of the original power dissipation. A further advantage of the circuit is that by reducing the current $I_1$ the input impedance of the circuit is increased because the emitter resistances of the transistors $T_1$ and $T_2$ increase as the currents decrease.

When the circuit is used for coupling two frequency dividers together a specific filtration of higher harmonics is obtained for the odd dividers owing to the substantial roll-off in gain at very high frequencies.

Figure 6:
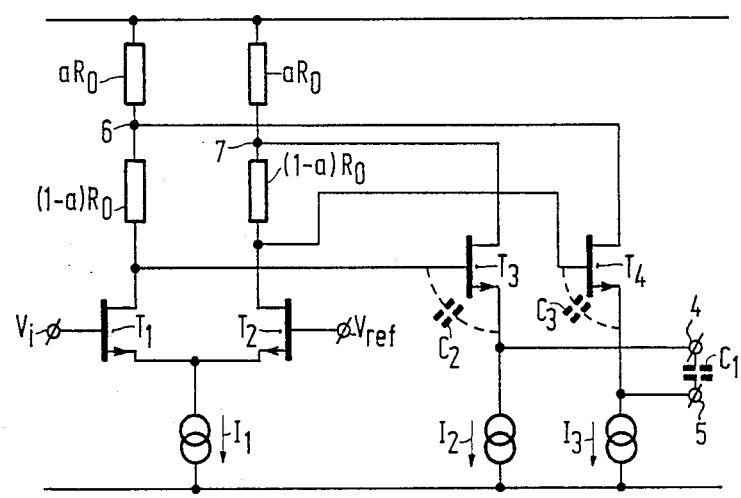
FIG. 6 shows a modification of the circuit of FIG. 3 which uses field effect transistors in place of the bipolar transistors.

The invention is not limited to the embodiment shown. For example, the input transistors and the emitter-follower transistors may be constructed as compound transistors and one or more diodes may be arranged in the emitter lines of the emitter-follower transistors to obtain a larger shift in level. The invention has been described for an embodiment using bipolar transistors. However, the transistors may also be field-effect transistors, as shown in FIG. 6, in which case "emitter", "collector", and "base" should read "source", "drain", and "gate", respectively.

What is claimed is:
1. A level shifting circuit comprising:

a differential amplifier comprising a first transistor and a second transistor, whose collectors are each coupled to a power-supply terminal via a load resistor, a first voltage-follower circuit comprising a third transistor connected as an emitter follower and having its base coupled to the collector of the first transistor, and a second voltage-follower circuit comprising a fourth transistor connected as an emitter follower and having its base coupled to the collector of the second transistor, characterized in that the collector of the third transistor is coupled to a tapping on the load resistor of the second transistor, and the collector of the fourth transistor is coupled to a tapping on the load resistor of the first transistor.

2. A modification of a circuit as claimed in claim 1, wherein the bipolar transistors are replaced by field-effect transistors.

3. A level shifting circuit comprising:
first and second transistors connected together as a differential amplifier and having emitter electrodes connected together to a first terminal of a power supply, a first load resistor coupling a collector of the first transistor to a second terminal of the power supply, a second load resistor coupling a collector of the second transistor to the second terminal of the power supply, a first voltage follower circuit comprising a third transistor connected as an emitter follower and having its base coupled to the collector of the first transistor, a second voltage follower circuit comprising a fourth transistor connected as an emitter follower and having its base coupled to the collector of the second transistor, means coupling the collector of the third transistor to a tap on the second load resistor, and means coupling the collector of the fourth transistor to a tap on the first load resistor.

4. A level shifting circuit as claimed in claim 3 wherein the emitter electrodes of the first and second transistors are connected together to said first power supply terminal via a source of current.

5. A level shifting circuit as claimed in claim 4 wherein the emitter electrodes of the third and fourth transistors are coupled to the first power supply terminal via respective second and third current sources.

6. A level shifting circuit comprising:
first and second field effect transistors (FETs) connected together as a differential amplifier and having source electrodes connected together to a first terminal of a power supply, a first load resistor coupling the drain electrode of the first FET to a second terminal of the power supply, a second load resistor coupling the drain electrode of the second FET to the second power supply terminal, a first voltage follower circuit comprising a third FET connected as a source follower and having its gate electrode coupled to the drain electrode of the first FET, a second voltage follower circuit comprising a fourth FET connected as a source follower and having its gate electrode coupled to the drain electrode of the second FET, means coupling the drain electrode of the third FET to a tap point on the second load resistor, and means coupling the drain electrode of the fourth FET to a tap on the first load resistor.

* * * * *